United States Patent

Satori et al.

[11] Patent Number: 5,822,248
[45] Date of Patent: Oct. 13, 1998

[54] NON-VOLATILE SEMICONDUCTOR MEMORY DEVICE USING FOLDED BIT LINE ARCHITECTURE

[75] Inventors: Kenichi Satori; Hiromi Nobukata, both of Kanagawa, Japan

[73] Assignee: Sony Corporation, Japan

[21] Appl. No.: 559,151

[22] Filed: Nov. 17, 1995

[30] Foreign Application Priority Data

Nov. 21, 1994 [JP] Japan ................................. 6-286740
Oct. 4, 1995 [JP] Japan ................................. 7-257876

[51] Int. Cl.⁶ .................................................. G11C 16/06
[52] U.S. Cl. .............................. 365/185.21; 365/185.11; 365/185.12; 365/185.13; 365/185.18; 365/185.26; 365/185.27
[58] Field of Search ......................... 365/185.21, 185.11, 365/185.13, 185.12, 185.26, 185.27, 185.18

[56] References Cited

U.S. PATENT DOCUMENTS

| 5,524,094 | 6/1996 | Nobukata et al. | 365/185.21 |
| 5,555,521 | 9/1996 | Hamada et al. | 365/185.21 |
| 5,602,777 | 2/1997 | Nawaki et al. | 365/185.21 |

Primary Examiner—Joseph E. Clawson, Jr.
Attorney, Agent, or Firm—Ronald P. Kananen

[57] ABSTRACT

A non-volatile memory device which enables use of a folded bit line system includes odd and even main bit lines, a plurality of sub-bit lines connected to the main bit lines through selection gates. Conductive and non-conductive states of the selection gate connecting to the odd main bit line and the selection gate connecting to the even main bit line are controlled by different selection signal lines so that the odd main bit line and the even bit line are operated selectively.

9 Claims, 14 Drawing Sheets

FIG. 13

|  | BL0N | BL0B | SG0n | SG1n | WL0n-3 n | pwell | nwell |
|---|---|---|---|---|---|---|---|
| Erase | Open | Open | 0V | 0V | +12V | -6V | Vcc |
| SG Program1 | +5V | 0V | -12V | +8V | 0V | 0V | Vcc |
| SG Program2 | 0V | +5V | +8V | -12V | 0V | 0V | Vcc |

NON-VOLATILE SEMICONDUCTOR MEMORY DEVICE USING FOLDED BIT LINE ARCHITECTURE

BACKGROUND OF THE INVENTION

1. Field of the Invention

The present invention relates to an electrically rewritable non-volatile memory, for example, a semiconductor non-volatile memory device such as a flash electrically erasable and programmable read only memory (EEPROM), more particularly, to a configuration of a memory cell for increasing the speed of the reading operation.

2. Background of the Invention

In the method of signal amplification used in a semiconductor memory device, for example, a dynamic random access memory (DRAM) circuit, use is made of a differential type sense amplifier connected to a pair of bit lines, including of a bit line and an inverted bit line having a complementary level. A reference level for the differential type sense amplifier is produced by connecting a dummy cell corresponding to a storage cell to a reference bit line and using the dummy cell as a reference cell in reading data from the storage cell.

Conventionally, it has been impossible for a flash EEPROM, particularly a so-called DINOR (DIvided bit-line NOR) type where bit lines are divided into main bit lines and sub-bit lines and a memory array is divided by selection gates or a contactless type, to adopt the so-called folded bit line method which is used in DRAMS and is so advantageous for enhancement of speed or for noise reduction in the memory array.

For this reason, in a DINOR type or contactless type flash EEPROM, there has been adopted an open bit line system (refer to for example Document 1: "A Quick Intelligent Program Architecture for 3V-only NAND-EEPROMS"; Symposium on VLSI Circuit pp. 20–21, 1992) in which two bit lines are positioned apart from each other at the two sides of a sense amplifier and memory cells formed as an array serving as the storage cells and dummy cells are connected to each of the bit lines.

In the above-mentioned open bit line system, however, even though use is made of a pair of bit lines with a complementary relationship, since the bit lines are separated in terms of position, there is liable to be an imbalance in the electrical characteristics between the two bit lines.

Further, the degree of imbalance in the noise voltage resulting from connecting another conductive body such as a peripheral circuit to the two bit lines of the open bit line system is larger than that of the folded bit line system. Consequently, is difficult to achieve an enhancement of sensitivity of the sense amplifier, and there are difficulties in enhancing the speed.

Also, to construct the folded bit line system, a divided bit line system having a divided bit line configuration (Document 2: "High Speed Page Mode Sensing Schem for EPROM's and Flash EEPROM'S using Divided Bit Line Architecture"; Symposium on VLSI Circuit pp. 97–98, 1990) has been proposed.

In this divided bit line system, however, it is necessary to provide a potential difference between a pair of a bit line and a reference bit line, then connect the divided bit lines again for the sense operation, so the potential difference is reduced to a half. Accordingly, the divided bit line system is disadvantageous for enhancement of speed.

SUMMARY OF THE INVENTION

The present invention has as its object to provide a semiconductor memory apparatus which can increase a speed of the reading operation by adopting a folded bit line system.

According to the present invention, there is provided a semiconductor non-volatile memory device which has a differential type sense amplifier connecting first and second bit lines in parallel and amplifying a voltage difference between the first bit line and the second bit line, including:

a first selection gate connected between the first bit line and a first sub-bit line, a second selection gate connected between the second bit line and a second sub-bit line, a first memory cell block having a plurality of memory cells which are connected between the first sub-bit line and a reference voltage source through the first selection gate, and a second memory cell block having a plurality of memory cells which are connected between the second sub-bit line and the reference voltage source through the second selection gate, wherein conductive and non-conductive states of the first memory cell block and the second memory cell block are controlled by a common word line group and conductive and non-conductive states of the first selection gate and the second selection gate are controlled by different selection signal lines and the first selection gate operatively connecting the first sub-bit line to the first bit line and the second selection gate operatively connecting the second sub-bit line to the second bit line.

Preferably, the semiconductor non-volatile memory device comprises a plurality of the first memory blocks and a plurality of the second memory blocks, and the first selection gate and the second selection gate are arranged on opposite sides of the common word line group.

Preferably, the semiconductor non-volatile memory device comprises a means for holding the potential of either of the first and second bit lines at a first potential and for setting the potential of the other bit line at a second potential different from the first potential for a predetermined time at the time of a reading operation.

Preferably, the first and second selection gates are each constituted by connecting two selection transistors in series, and either selection transistor of the two selection transistors is constituted by a depletion type transistor.

More preferably, the depletion transistor is formed by implanting an impurity of a predetermined density into a channel area of a transistor.

More preferably, the depletion type transistor is constituted by a transistor having a charge accumulation layer.

More preferably, a threshold of the depletion type transistor is reset at the time of an erasing operation of the first memory cell block and the second memory cell block.

Further, according to the present invention, there is provided a semiconductor non-volatile memory device which has a main bit line, a plurality of sub-bit lines connected to the main bit line through selection gates and a plurality of memory cells connected between the plurality of sub-bit lines and a reference voltage source. The selection gates are each constituted by connecting two selection transistors in series and either selection transistor of the two selection transistors is constituted by a depletion type transistor having a charge accumulation layer and a variable threshold.

Preferably, the threshold of the depletion type transistor is reset at the time of an erasing operation of the memory cells.

According to the present invention, even when selecting one memory cell from the plurality of memory cells connected to a common word line, only the memory cell desired to be selected is accessed since the memory cells are connected operatively in accordance with different selection signals.

Further, according to the present invention, for example at the time of precharging, the first and second bit lines are held at the same potential, but when for example reading data from a memory cell of the first memory cell block, the second bit line is held at a first potential, and the first bit line is held at a second potential higher than the first potential for a predetermined time. After the predetermined time, the reading data is read out by the sense amplifier.

Further, according to the present invention, the connection states between the blocks and bit lines are controlled by selection gates each constituted by two selection transistors connected in series.

Further, according to the present invention, for holding the stable depletion state of the depletion type transistor of the selection gate, the threshold of the transistor is reset at the time of a usual erasing operation.

BRIEF DESCRIPTION OF THE DRAWINGS

These and other objects and features of the present invention will become more apparent from the following description of the preferred embodiments made with reference to the drawings, in which:

FIG. 13 is a table of the bias conditions of the bit lines, selection gate line, word line, and wells at the time of an erasing operation and setting the threshold voltage of the selection gate.

DESCRIPTION OF THE PREFERRED EMBODIMENTS

Before describing the preferred embodiments, the related art will be explained in further detail with reference to the drawings for background purposes.

Figure 1:
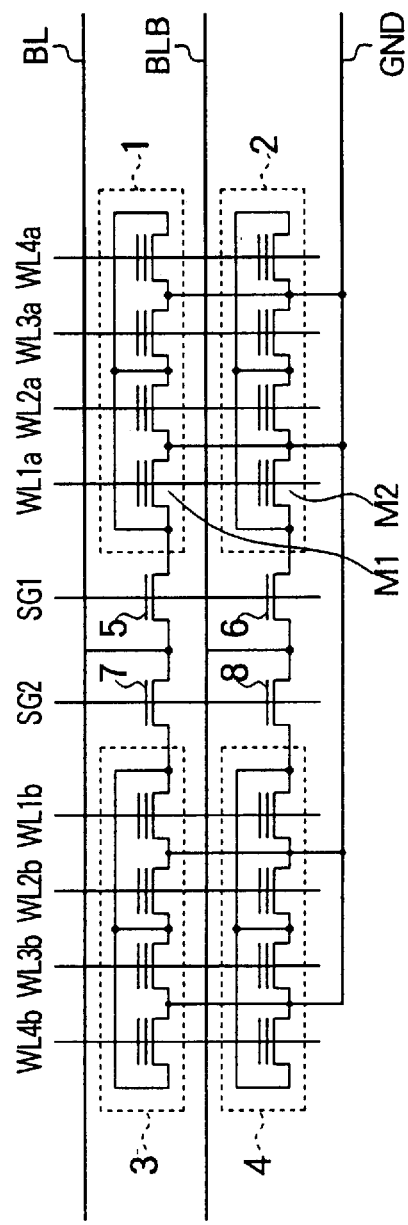
FIG. 1 is a circuit diagram of a part of a memory array for explaining disadvantages of the related art.

As shown in FIG. 1, in the related art, a DINOR type semiconductor non-volatile memory device has a pair of main bit lines BL and BLB arranged closely in parallel and memory cell blocks 1 to 4.

The memory cell block 1 is connected to the main bit line BL through a selection gate 5. The memory cell block 3 is connected to the main bit line BL through a selection gate 7, and the memory cell blocks 1 and 3 are arranged in the same direction as the bit lines.

The memory cell block 2 is connected to the main bit line BLB through a selection gate 6. The memory cell block 4 is connected to the main bit line BLB through a selection gate 8, and the memory cell blocks 6 and 8 are arranged in the same direction as the bit lines.

Gate electrodes of the memory cells of the memory cell blocks 1 and 2 are connected to common word lines WL1a to WL4a. Gate electrodes of the memory cells of the memory cell blocks 3 and 4 are connected to common word lines WL1b to WL4b. Gate electrodes of the metal oxide semiconductor (MOS) transistors constructing the selection gates 5 and 6 are connected to a common selection signal line SG1, and gate electrodes of the MOS transistors constructing the selection gates 7 and 8 are connected to a common selection signal line SG2.

However, in the above-mentioned DINOR type semiconductor non-volatile memory device, for example, when a memory cell M2 of the memory cell block 2 is selected, a memory cell M1 of the memory cell block 1 is selected at the same time. A drain of the memory cell M2 is connected to the bit line BLB through the selection gate 6 and a drain of the memory cell M1 is connected to the bit line BL through the selection gate 5, so it is impossible to use the bit lines arranged closely as reference bit lines.

As a result, in the DINOR type or contactless type flash EEPROM, there has been adopted the open bit line system in which two bit lines are arranged separated from each other across a sense amplifier and arrays of memory cells serving as the storage cells and dummy cells are connected to each of the bit lines.

Preferred embodiments of the invention will now be explained in detail with reference to the drawings.

Figure 2:
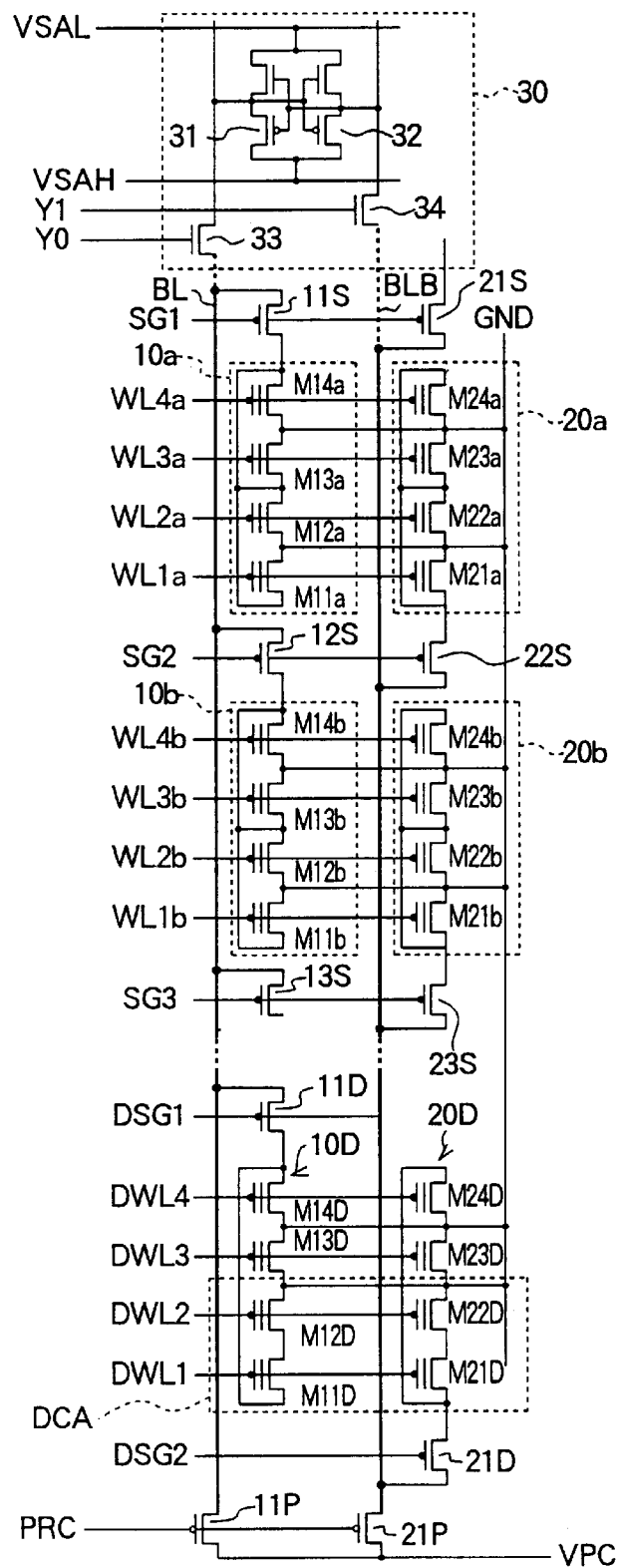
FIG. 2 is a circuit diagram of a first embodiment of a semiconductor non-volatile memory device adopting a folded bit line system according to the present invention.

FIG. 2 is a circuit diagram of a first embodiment of a semiconductor non-volatile memory device adopting a folded bit line system according to the present invention.

In FIG. 2, 10a, 10b, 20a and 20b represent DINOR type memory cell blocks, 11S, 12S, 13S, 21S, 22S and 23S represent selection gates, 10D and 20D represent dummy cell blocks, 11D and 21D represent selection gates for dummy cells, 11P and 21P represent transmission gates for precharging, 30(SA) represents a sense amplifier, BL represents a main bit line, BLB represents a main inverted bit line, WL1a to WL1b and WL1b to WL4b represent word lines, DWL1 to DWL4 represent dummy word lines, SG1, SG2 and SG3 represent selection signal supply lines, DSG1 and DSG2 represent dummy selection signal supply lines, and PRC represents a precharge control line.

In this memory array, the memory cell blocks 10a and 20a connected to the common word lines and the memory cell blocks 10b and 20b connected to the common word lines are connected to the bit line BL or the inverted bit line BLB through the selection gates 11S, 12S, 22S and 23S which are constituted by MOS transistors. Gate electrodes of these transistors are connected to different selection signal supply lines.

The memory cell block 10a is connected to the bit line BL through the selection gate 11S. The memory cell block 20a, which is connected to the common word lines WL1a to WL4a with the memory cell block 10a is connected to the inverted bit line BLB through the selection gate 22S. In the same way, the memory cell block 10b is connected to the bit line BL through the selection gate 12S. The memory cell block 20b connected to the common word lines WL1b to WL1b with the memory cell block 10b is connected to the inverted bit line BLB through the selection gate 23S.

The gate electrode of the selection gate 11S is connected to the selection signal supply line SG1 together with the gate electrode of the selection gate 21S which operatively connects the memory cell block not shown in FIG. 1 to the inverted bit line BLB. The gate electrode of the selection gate 12S is connected to the selection signal supply line SG2 together with the gate electrode of the selection gate 22S which operatively connects the memory cell block 20a to the inverted bit line BLB. The gate electrode of the selection gate 23S is operatively connected to the selection signal supply line SG3 together with the gate electrode of the selection gate 13S which operatively connects a memory cell block not shown in FIG. 1 to the bit line BL.

Also, a gate electrode of a memory cell M11a in the memory cell block 10a is connected to the word line WL1a together with a gate electrode of a memory cell M21a in the memory cell block 20a. A gate electrode of a memory cell M12a in the memory cell block 10a is connected to the word line WL2a together with a gate electrode of a memory cell M22a in the memory cell block 20a. A gate electrode of a memory cell M13a in the memory cell block 10a is connected to the word line WL3a together with a gate electrode of a memory cell M23a in the memory cell block 20a. A gate of a memory cell M14a in the memory cell block 10a is connected to the word line WL4a together with a gate electrode of a memory cell M24a in the memory cell block 20a.

Similarly, a gate electrode of the memory cell M11b in the memory cell block 10b is connected to the word line WL1b together with a gate electrode of a memory cell M21b in the memory cell block 20b. A gate electrode of a memory cell M12b in the memory cell block 10b is connected to the word line WL2b together with a gate electrode of a memory cell M22b in the memory cell block 20b. A gate electrode of a memory cell M13b in the memory cell block 10b is connected to the word line WL3b together with a gate electrode of a memory cell M23b in the memory cell block 20b. A gate of a memory cell M14b in the memory cell block 10b is connected to the word line WL4b together with a gate electrode of a memory cell M24b in the memory cell block 20b.

Gate electrodes of the dummy selection gates M11D and M21D constituted by n-channel MOS transistors are connected to the different dummy selection signal supply lines DSG1, DSG2 respectively.

Further, a gate electrode of a dummy memory cell M11D in the dummy memory cell block 10D is connected to the dummy word line DWL1 together with a gate electrode of a dummy memory cell M21D in the dummy memory cell block 20D. A gate electrode of a dummy memory cell M12D in the dummy memory cell block 10D is connected to the dummy word line DWL2 together with a gate electrode of a dummy memory cell M22D in the dummy memory cell block 20D. A gate electrode of a dummy memory cell M13D in the dummy memory cell block 10D is connected to the dummy word line DWL3 together with a gate electrode of a dummy memory cell M23D in the dummy memory cell block 20D. A gate electrode of a dummy memory cell M14D in the dummy memory cell block 10D is connected to the dummy word line DWL4 together with a gate electrode of a dummy memory cell M24D in the dummy memory cell block 20D.

One end of the bit line BL and the inverted bit line BLB are connected to the sense amplifier 30, and the other ends of the bit lines BL, BLB are connected to a common precharge voltage supply line VPC through the transmission gates for precharging 11P, 21P which are constituted by p-channel MOS transistors respectively. Gate electrodes of the transmission gates for precharging 11P and 12P are connected to the common precharge control line PRC.

The sense amplifier 30 is configured as a flip-flop type sense amplifier comprised of a CMOS inverter 31 and a CMOS inverter 32 with inputs and outputs connected crosswise.

An output node of the inverter 31 is connected to the bit line through a transmission gate 33 constituted by an n-channel MOS transistor. An output node of the inverter 32 is connected to the inverted bit line BLB through a transmission gate 34 constituted by an n-channel MOS transistor.

Figure 3:
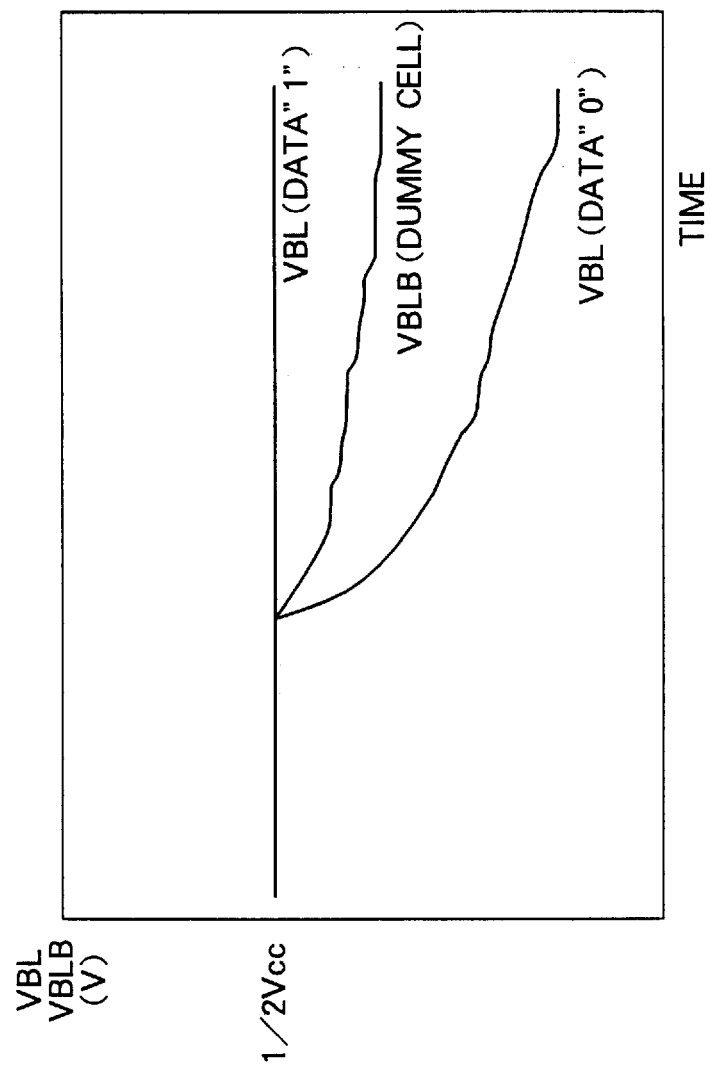
FIG. 3 is a view for explaining the operation of the circuit of FIG. 2.

An explanation will be made next of the operation of the above-described structure with reference to FIG. 3. Note that, the dummy memory cells are in a written state, and a precharge voltage is about Vcc/2 in this explanation. Vth represents a threshold voltage of the memory cell, and Vcc represents a power supply voltage.

For example, when data stored in the memory cell M11a of the memory cell block 10a connected to the bit line BL is read out, first the precharge control line PRC is set to a low level for a predetermined time.

Due to this, the transmission gates 11P and 21P switch from the non-conductive state to the conductive state. As a result, the bit line BL and the inverted bit line BLB are precharged to about the Vcc/2 level. At this time, the driving signals for sense amplifiers VSAH and VSAL are held at the Vcc/2 level.

Next, the word line WL1a and the selection signal supply line SG1 are set to a high level. As a result, the memory cell M11a, which is connected to the bit line BL, is selected.

At the same time, the dummy selection signal supply line DSG2 and the dummy word line DWL1, DWL2 are set to the high level. As a result, the dummy memory cells M21D and M22D, which are connected to the inverted bit line BLB, are selected.

Due to this, when the memory cell M11a is in an erased state (data "1"), the potential of the bit line BL is held at about Vcc/2 according to the data of the memory cell M11a. On the other hand, when the memory cell M11a is in a written state (data "0"), the potential of the bit line BL shifts to lower than the potential of the inverted bit line BLB.

After a predetermined time, signals Y0 and Y1 are set to the high level. Due to this, the transmission gates 33 and 34 switch from the non-conductive state to the conductive state. As a result, the bit line BL and the inverted bit line BLB are connected to the sense amplifier 30.

The driving signal for the sense amplifier VSAH is set to the power supply voltage Vcc level, and the driving signal for the sense amplifier VSAL is set to the ground GND level. As a result, a potential difference generated between the bit line BL and the inverted bit line BLB is amplified by the above-mentioned reading operation.

Also, when data stored in the memory cell M24b of the memory cell block 20b connected to the inverted bit line BLB is read out, first, the precharge control line PRC is set to a low level for a predetermined time. Due to this, the transmission gates 11P and 21P switch from the non-conductive state to the conductive state. As a result, the bit line BL and the inverted bit line BLB are precharged to about the Vcc/2 level.

At this time, the driving signals for the sense amplifier VSAH and VSAL are held at the Vcc/2 level.

Next, the word line WL4b and the selection signal supply line SG3 are set to a high level. As a result, the memory cell M24b, which is connected to the inverted bit line BLB, is selected. At the same time, the dummy selection signal supply line DSG1 and the dummy word lines DW11, DWL2 are set to the high level. As a result, the dummy memory cells M11D and M12D, which are connected to the bit line BL, are selected.

Due to this, when the memory cell M24b is in an erased state (data "1"), the potential of the inverted bit line BLB is held at about Vcc/2 according to the data of the memory cell M24b. On the other hand, when the memory cell M24b is in a written state (data "0"), the potential of the inverted bit line BLB shifts to lower than a potential of the bit line BL.

After a predetermined time, the signals Y0 and Y1 are set to the high level. Due to this, the transmission gates 33 and 34 switch from the non-conductive state to the conductive state. As a result, the bit line BL and the inverted bit line BLB are connected to the sense amplifier 30.

The driving signal for the sense amplifier VSAH is set to the power supply voltage Vcc level, and the driving signal for the sense amplifier VSAL is set to the ground GND level. As a result, a potential difference generated between the bit line BL and the inverted bit line BLB is amplified by the above-mentioned reading operation.

As explained above, according to the first embodiment, the memory cell blocks 10a, 20a and the memory cell blocks 10b, 20b, which are connected to the common word lines and the different bit line BL and inverted bit line BLB, are connected to the bit line BL or the inverted bit line BLB through the selection gates 11S, 12S, 22S and 23S which are constituted by n-channel MOS transistors gate electrods of which are connected to different selection signal supply lines. Thus, it is possible for the semiconductor non-volatile memory device, for example, a flash memory, to adopt the folded bit line system.

As a result, the layout design becomes easy. Also, various noise acts in exactly the same way on the bit line BL and the inverted bit line BLB. Therefore, the influence of the noise can be suppressed to the lowest level. Accordingly, it is possible to raise the sensitivity of the sense amplifier 30 and to achieve an enhancement of speed.

Note that, in the first embodiment, the explanation was made of case where two dummy memory cells in a dummy cell part DCA are connected in series. The present invention is not limited this. The present invention can be applied to connection in parallel of the dummy memory cells, for example, by adjusting the threshold voltage Vth to a middle level of Ids of the erased state and the written state.

Also, generally, in a flash EEPROM writing data by FN tunneling, it is necessary to have a data latch circuit for latching write data at the time of a writing operation. Similarly, in the case of using a current sense amplifier, it is necessary to have another data latch circuit for latching write data in addition to the sense amplifier. According to the present invention, however, it is possible to make common use of the sense amplifier for reading and the data latch circuit for write data. As a result, a reduction of the chip area can be realized.

Figure 4:
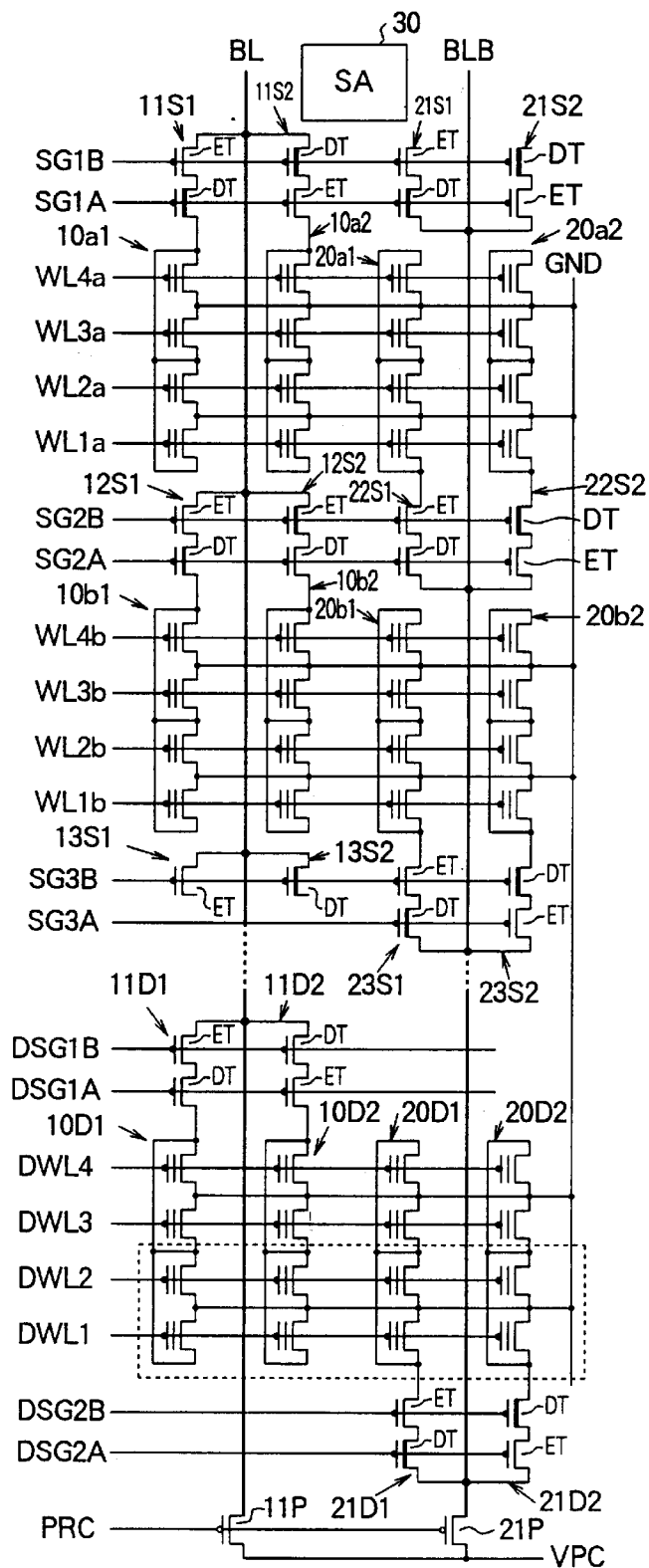
FIG. 4 is a circuit diagram of a second embodiment of a semiconductor non-volatile memory device adopting a folded bit line system according to the present invention.

FIG. 4 is a circuit diagram of a second embodiment of a semiconductor non-volatile memory device according to the present invention.

The differences of this second embodiment with the first embodiment are that two upper selective transistors constructing the selection gate are provided, one being made to act as a depletion type transistor DT, another being made to act as an enhancement type transistor ET, whereby two lines memory cell blocks are connected to one main bit line BL and one main inverted bit line BLB.

A memory cell block 10a1 is connected to the bit line BL through a selection gate 11S1. A memory cell block 10a2 is connected to the bit line BL through a selection gate 11S2. A memory cell block 10b1 is connected to the bit line BL through a selection gate 12S1. A memory cell block 10b2 is connected to the bit line through a selection gate 12S2.

Similarly, a memory cell block 20a1 is connected to the inverted bit line BLB through a selection gate 22S1, a memory cell block 20a2 is connected to the inverted bit line through a selection gate 22S2. A memory cell block 20b1 is connected to the inverted bit line BLB through a selection gate 23S1. A memory cell block 20b2 is connected to the inverted bit line through a selection gate 23S2.

The selection gates 11S1, 11S2 and the selection gates 21S1, 21S2 are connected to common selection signal supply lines SG1A, SG1B. The selection gates 12S1, 12S2 and the selection gates 22S1, 22S2 are connected to common selection signal supply lines SA2A, SG2B, and the selection gates 13S1, 13S2 and the selection gates 23S1, 23S2 are connected to common selection signal lines SG3A, SG3B.

Two selection gates are connected in parallel to the bit line BL or the inverted bit line BLB. The enhancement type transistor ET of one of the selection gates and the depletion type transistor DT of another of them are connected to the common selection signal supply line.

Figure 5:
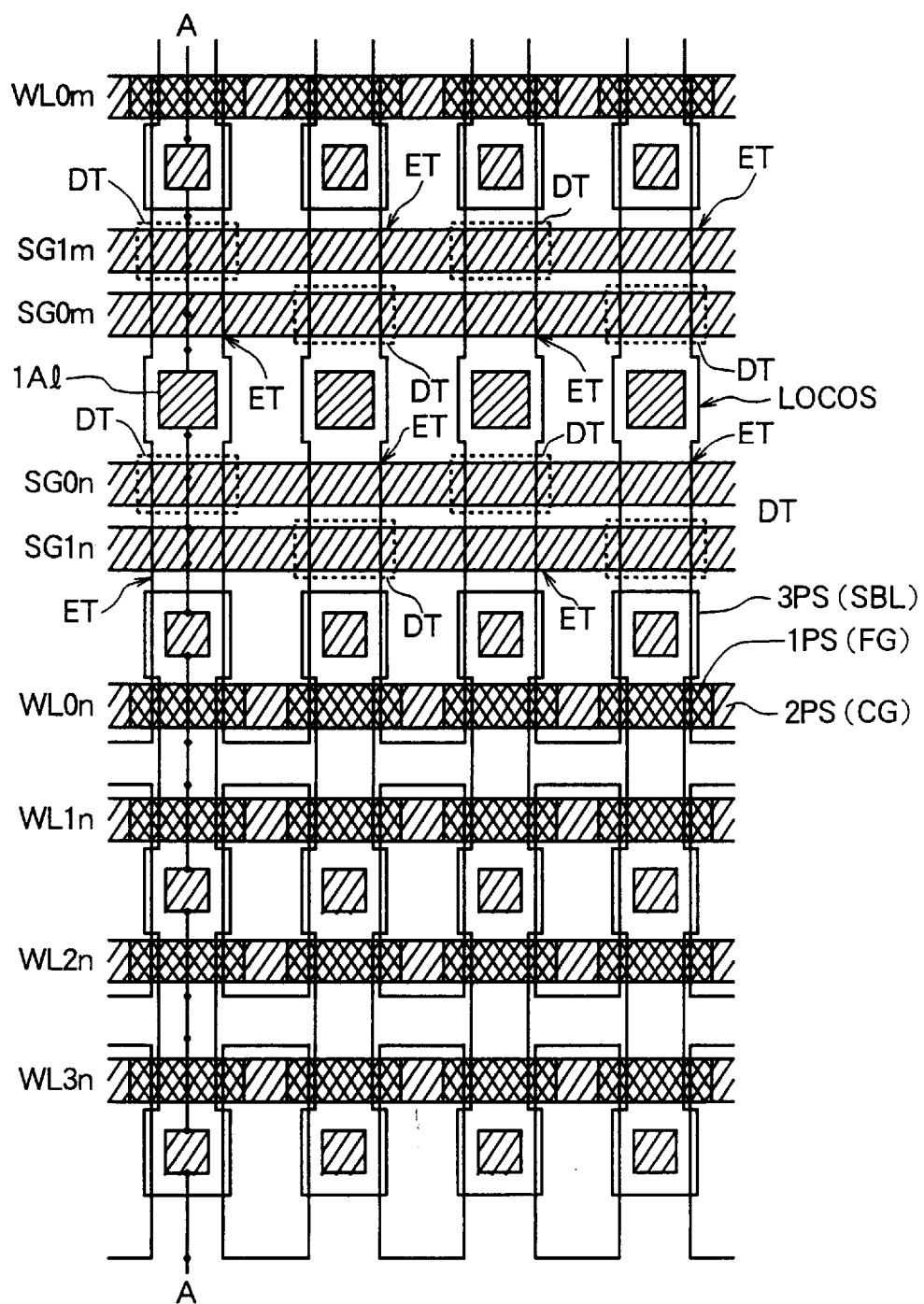
FIG. 5 is a plane view of principal parts of the semiconductor non-volatile memory device of FIG. 4.
Figure 6:
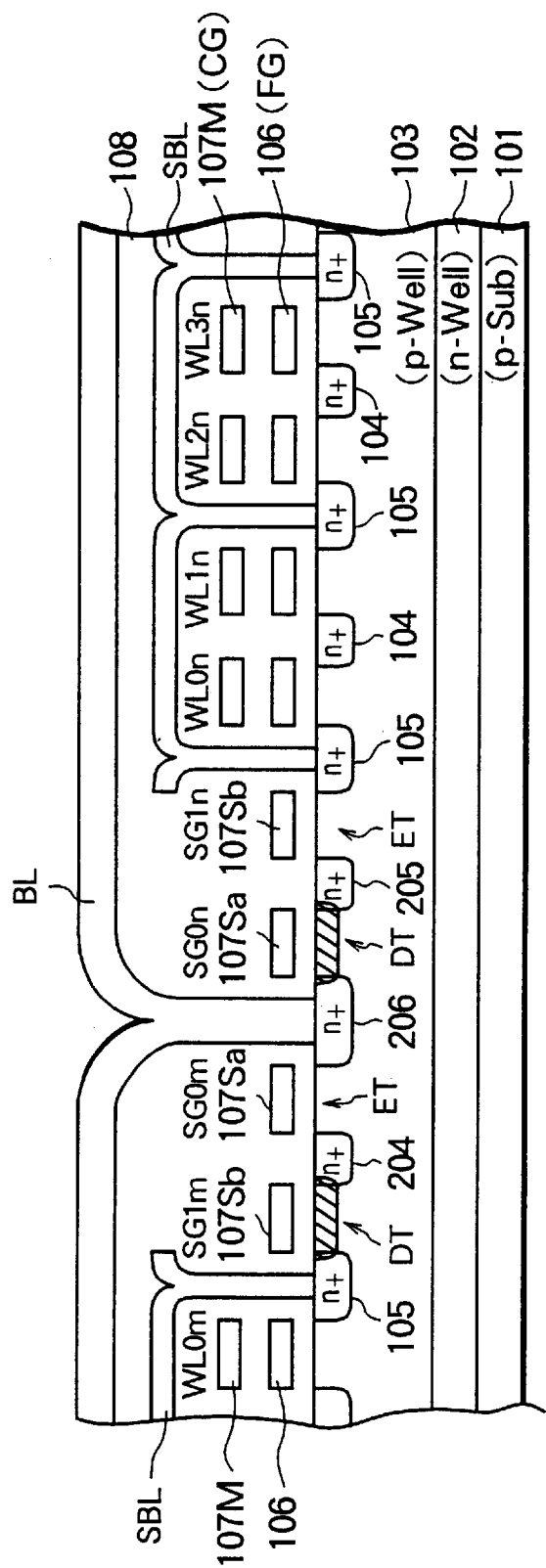
FIG. 6 is a cross-sectional view taken along a line A—A in FIG. 4.

FIG. 5 is a plane view of a principal part showing an example of the actual structure of a semiconductor non-volatile memory device in which two upper selection transistors constructing the selection gate are provided, one being made to act as a depletion type transistor DT, another being made to act as an enhancement type transistor ET. FIG. 6 is a schematic cross-sectional view taken along a line A—A in FIG. 5. Note that, in FIG. 6, the hatching is omitted for simplifying the drawing.

The semiconductor non-volatile memory device in FIG. 5 and FIG. 6 has a triple well structure. As shown in FIG. 6, an n-type well 102 is formed in a p-type semiconductor substrate 101, a p-type well 103 is formed in the n-type well 102, and source diffusion layers or drain diffusion layers 104, 105, 204, 205, 206 are formed on predetermined positions in the p-type well 103.

The memory cell transistor has a floating gate (FG) 106 as a charge accumulation layer constituted by a first layer of polycrystalline silicon (1PS), and the selection transistors connected in parallel with the selection gate are comprised of usual nMOS transistors.

In the production process, the depletion type transistor DT was constituted by implanting an n-type impurity, for example, phosphorus (P) ions, in a channel area of an nMOS transistor.

Also in the figure, 107M represents a control gate (CG) for the memory cell transistor constituted by a second layer of polycrystalline silicon (2PS). 107Sa and 107Sb represent control gates (CG) for the selection gate constituted by the second layer of polycrystalline silicon (2PS). 108 represents an interlayer insulator film constituted by, for example, $SiO_2$. BL represents a main bit line constituted by a first layer of aluminum (1Al). SBL represents sub-bit lines constituted by a third layer of polycrystalline silicon (3PS), and 1AC represents contacts for 1Al. Note that, a gate insulator film is omitted.

In this second embodiment, the reading operation is performed in the same way as in the above-mentioned first embodiment.

According to the second embodiment, it is possible for the semiconductor non-volatile memory device, for example, a flash memory, to adopt the folded bit line system in the same way as the above-mentioned first embodiment.

As a result, the layout design becomes easy. Also, various noise acts in exactly the same way on the bit line BL and the inverted bit line BLB. Therefore, the influence of the noise can be suppressed to the lowest level. Accordingly, it is possible to raise the sensitivity of the sense amplifier and to achieve an enhancement of speed.

Figure 7:
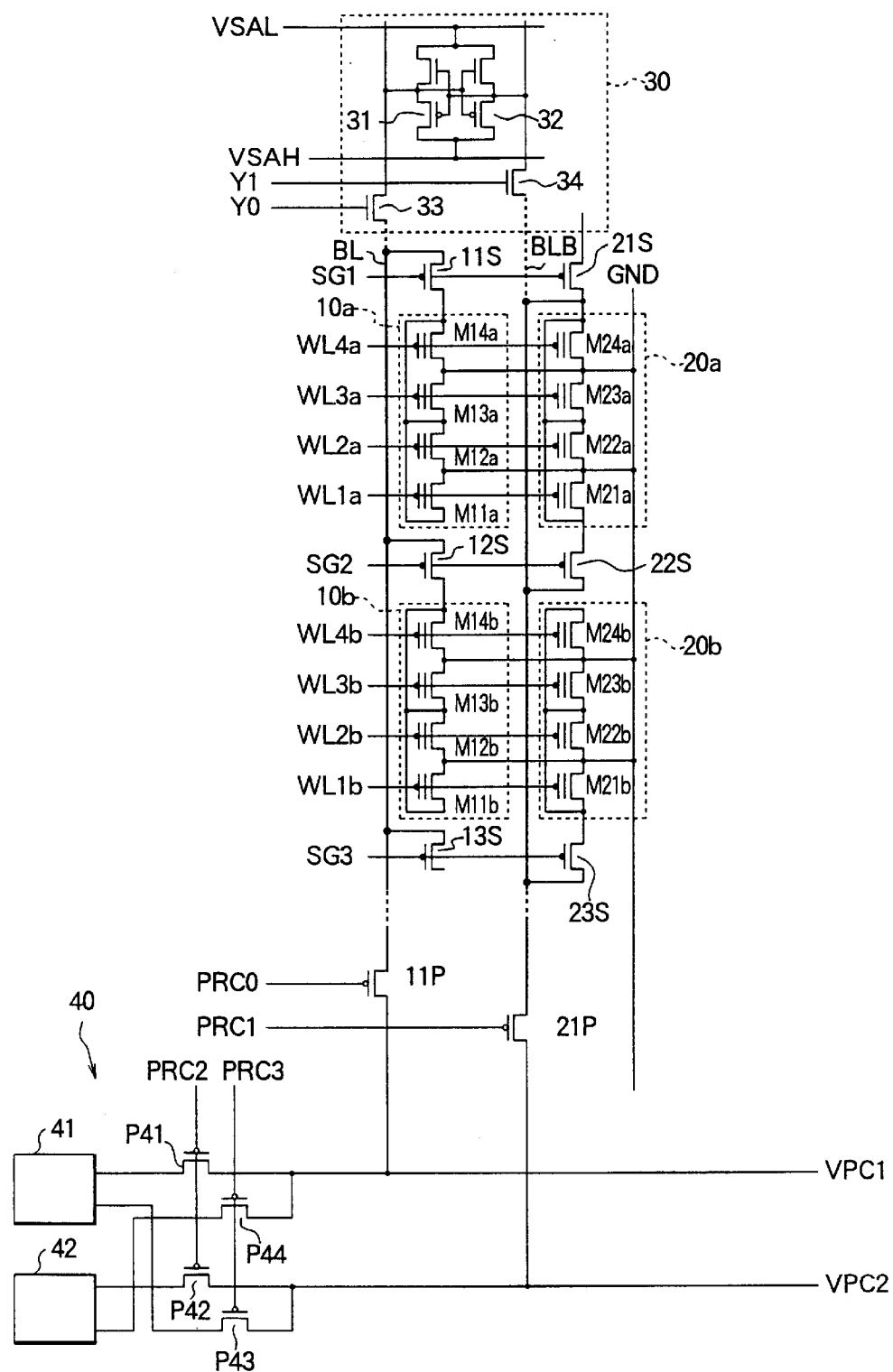
FIG. 7 is a circuit diagram of a third embodiment of a semiconductor non-volatile memory device adopting a folded bit line system according to the present invention.

FIG. 7 is a circuit diagram of a third embodiment according to the present invention.

The differences of this third embodiment with the first embodiment are that a bit line voltage adjustment circuit 40 is provided for, holding the potential of either the bit line BL and the inverted bit line BLB at about Vcc/2+α ($\alpha \approx 0.02 \sim 0.2$V) and setting the potential of the other bit line at Vcc/2 for a predetermined time. Thus, it is possible for the semiconductor non-volatile memory device to adopt the folded bit line structure without the use of a dummy memory cell.

Gate electrodes of transmission gates for precharging 11P, 21P are connected to the different precharge control lines PRC0, PRC1, respectively. A precharge voltage supply line VPC1 is connected to the transmission gate 11P, and a precharge voltage supply line VPC2 is connected to the transmission gate 21P.

The bit line voltage adjustment circuit 40 includes a power supply circuit 41 supplying the voltage Vcc/2+α, a power supply circuit 42 supplying the voltage Vcc/2, a p-channel MOS (PMOS) transistor P41 operatively connecting one of two output terminals of the power supply circuit 41 and the precharge voltage supply line VPC1 in accordance with the level of the precharge control line PRC2, a PMOS transistor P42 operatively connecting one of two output terminals of the power supply circuit 42 and the precharge voltage supply line VPC2 in accordance with the level of the precharge control line PRC2, a PMOS transistor P43 operatively connecting another of the two output terminals of the power supply circuit 41 and the precharge voltage supply line VPC2 in accordance with the level of the precharge control line PRC3, and a PMOS transistor P44 operatively connecting another of the two output terminals of the power supply circuit 42 and the precharge voltage supply line VPC1 in accordance with the level of the precharge control line PRC3.

Figure 8:
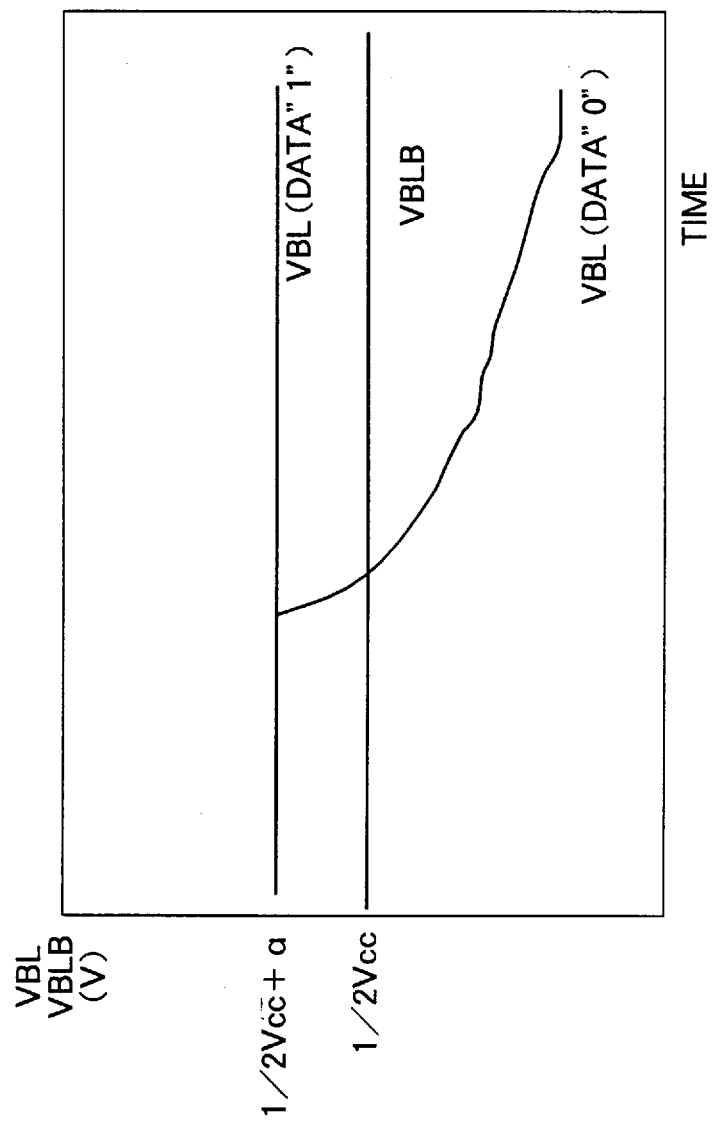
FIG. 8 is a view for explaining the operation of the circuit of FIG. 7.

An explanation will be made next of the operation of the structure of FIG. 7 with reference to FIG. 8. Note that, the explanations will be made while taking as an example a case where the voltage of the precharge voltage supply line VPC1 is adjusted to Vcc/2+α, and the voltage of the precharge voltage supply line VPC2 is adjusted to Vcc/2.

For example, when data stored in the memory cell M11a of the memory cell block 10a connected to the bit line BL is read out, the precharge control line PRC2 is set to a low level and the precharge control line PRC3 is set to a high level. Due to this, the PMOS transistors P41 and P42 switch from the non-conductive state to the conductive state, and the PMOS transistors P43 and P44 are held in the non-conductive state. As a result, the voltage Vcc/2+α is supplied from the power supply circuit 41 to the precharge voltage supply line VPC 1 and the voltage Vcc/2 is supplied form the power supply circuit 42 to the precharge voltage supply line VPC2.

Next, the precharge control lines PRC0 and PRC1 are set to a low level for a predetermined time. Due to this, the transmission gates 11P and 21P switch from the non-conductive state to the conductive state. As a result, the bit line BL is precharged to Vcc/2+α, and the inverted bit line BLB is precharged to Vcc/2. At this time, the driving signals for the sense amplifier VSAH and VSAL are held at about Vcc/2.

Next, the word line WL1a and the selection signal supply line SG1 are set to a high level and, as a result, the memory cell M11a is selected.

Due to this, when the memory cell M11a is in an erased state (data "1"), the potential of the bit line BL is held at about Vcc/2+α according to the data of the memory cell M11a. On the other hand, when the memory cell M11a is in a written state (data "0"), the potential of the bit line BL shifts to lower than a potential of the inverted bit line BLB.

After a predetermined time, the signals Y0 and Y1 are set to the high level. Due to this, the transmission gates 33 and 34 switch from the non-conductive state to the conductive state. As a result, the bit line BL and the inverted bit line BLB are connected to the sense amplifier 30.

The driving signal for the sense amplifier VSAH is set to the power supply voltage Vcc level, and the driving signal for the sense amplifier VSAL is set to the ground GND level. As a result, a potential difference generated between the bit line BL and the inverted bit line BLB is amplified by the above-mentioned reading operation.

Also, when data stored in the memory cell M24b of the memory cell block 20b connected to the bit line BL is read out, the precharge control line PRC2 is set to a high level and the precharge control line PRC3 is set to a low level. Due to this, the PMOS transistors P41 and P42 are held in the non-conductive state, and the PMOS transistors P43 and P44 switch from the non-conductive state to the conductive state. As a result, the voltage Vcc/2+α is supplied from the power supply circuit 41 to the precharge voltage supply line VPC2 and the voltage Vcc/2 is supplied from the power supply circuit 42 to the precharge voltage supply line VPC1.

Next, the precharge control lines PRC0 and PRC1 are set to a low level for a predetermined time. Due to this, the transmission gates 11P and 21P switch from the non-conductive state to the conductive state. As a result, the inverted bit line BLB is precharged to Vcc/2+α, and the bit line BL is precharged to Vcc/2. At this time, the driving signals for the sense amplifier VSAH and VSAL are held at about Vcc/2.

Next, the word line WL4b and the selection signal supply line SG3 are set to a high level. As a result, the memory cell M24b is selected.

Due to this, when the memory cell M24b is in an erased state (data "1"), the potential of the inverted bit line BLB is held at about Vcc/2+α according to the data of the memory cell M24b. On the other hand, when the memory cell M24b is in a written state (data "0"), the potential of the inverted bit line BLB shifts to lower than a potential of the bit line BL.

After a predetermined time, the signals Y0 and Y1 are set to the high level. Due to this, the transmission gates 33 and 34 switch from the non-conductive state to the conductive state. As a result, the bit line BL and the inverted bit line BLB are connected to the sense amplifier 30.

The driving signal for the sense amplifier VSAH is set to the power supply voltage Vcc level, and the driving signal for the sense amplifier VSAL is set to the ground GND level. As a result, the potential difference generated between the bit line BL and the inverted bit line BLB is amplified by the above-mentioned reading operation.

According to the third embodiment, it is possible to adopt the folded bit line system without use of a dummy cell even if the memory cell connected to the bit line BL and memory cell connected to the inverted bit line BLB are connected to one word line.

As a result, the layout design becomes easy. Also, various noise acts in exactly the same way on the bit line and the inverted bit line. Therefore, the influence of the noise can be suppressed to the lowest level. Accordingly, it is possible to raise the sensitivity of the sense amplifier and to achieve an enhancement of speed.

Figure 9:
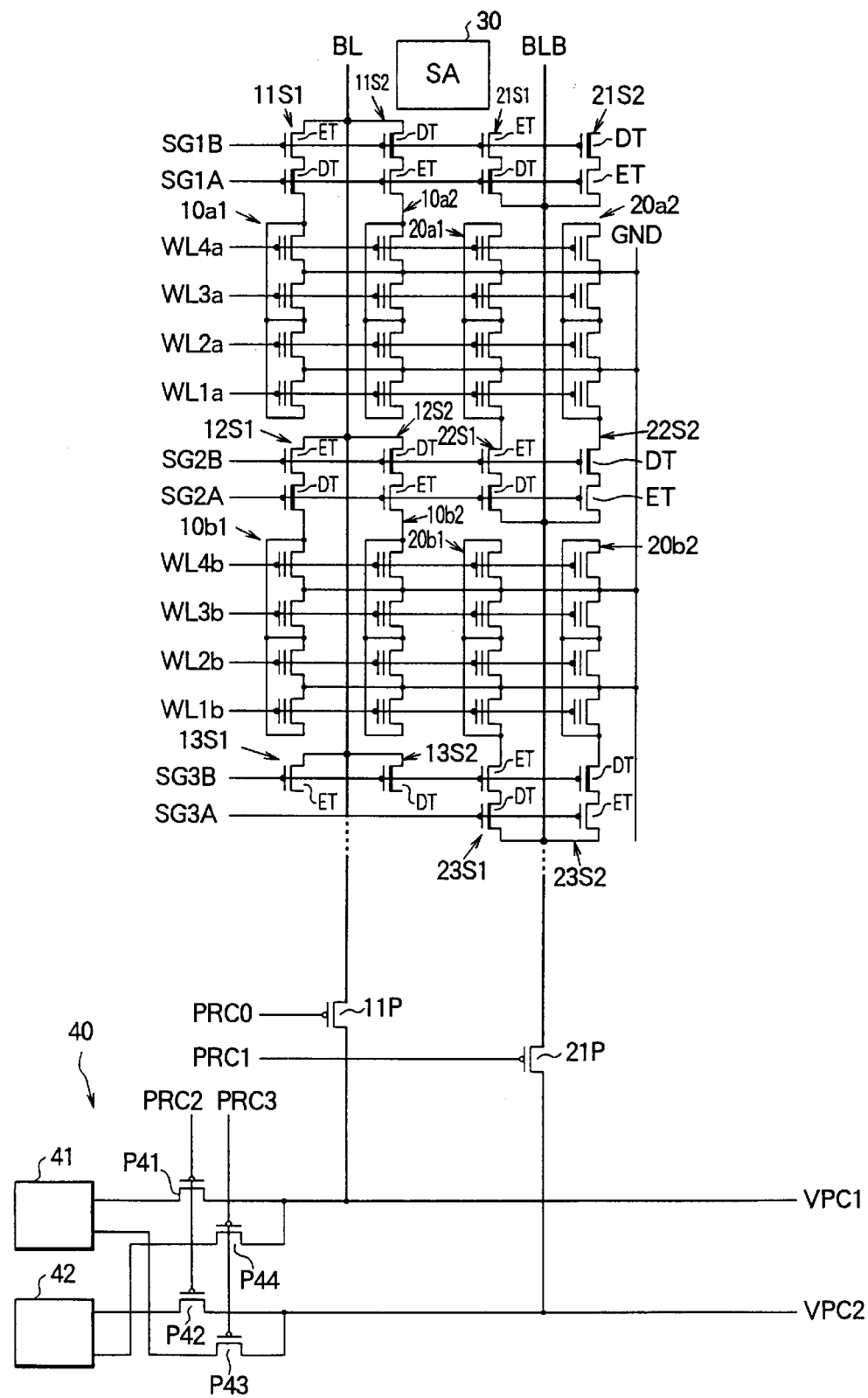
FIG. 9 is a circuit diagram of a fourth embodiment of a semiconductor non-volatile memory device adopting a folded bit line system according to the present invention.

FIG. 9 is a circuit diagram of a fourth embodiment of a semiconductor non-volatile memory device according to the present invention.

The differences of this fourth embodiment with the third embodiment are that two upper selective transistors constructing the selection gate are provided, one being made to act as a depletion type transistor DT, another being made to act as an enhancement type transistor ET in the same way as with above-mentioned second embodiment, whereby two memory cell blocks are connected to one main bit line BL and one main inverted bit line BLB.

In this fourth embodiment, the rest of the construction is the same as with the above-mentioned third embodiment, and similar effects can be obtained as with the above-mentioned third embodiment.

Figure 10:
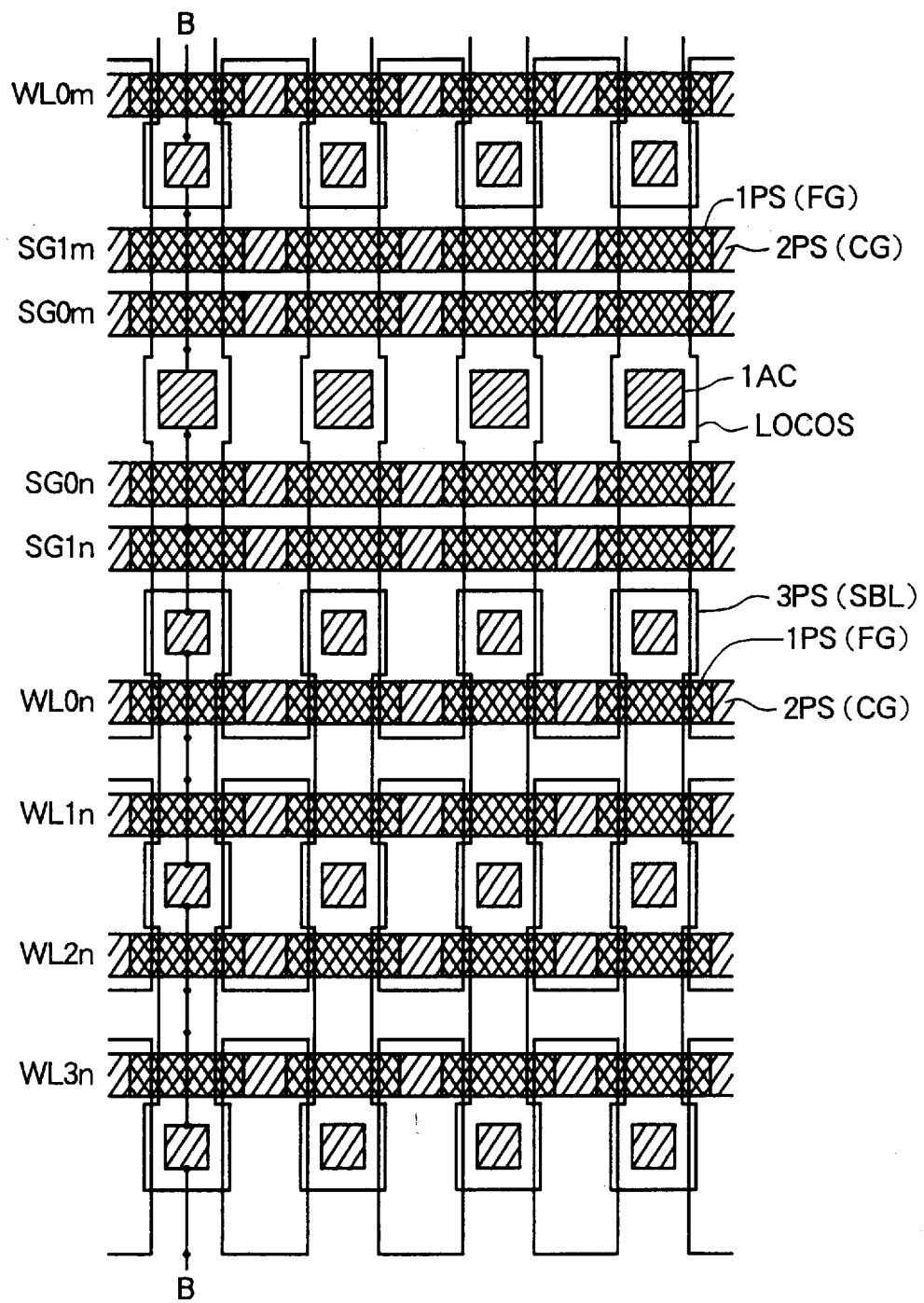
FIG. 10 is a circuit diagram of a fifth embodiment of a semiconductor non-volatile memory device adopting a folded bit line system according to the present invention.
Figure 11:
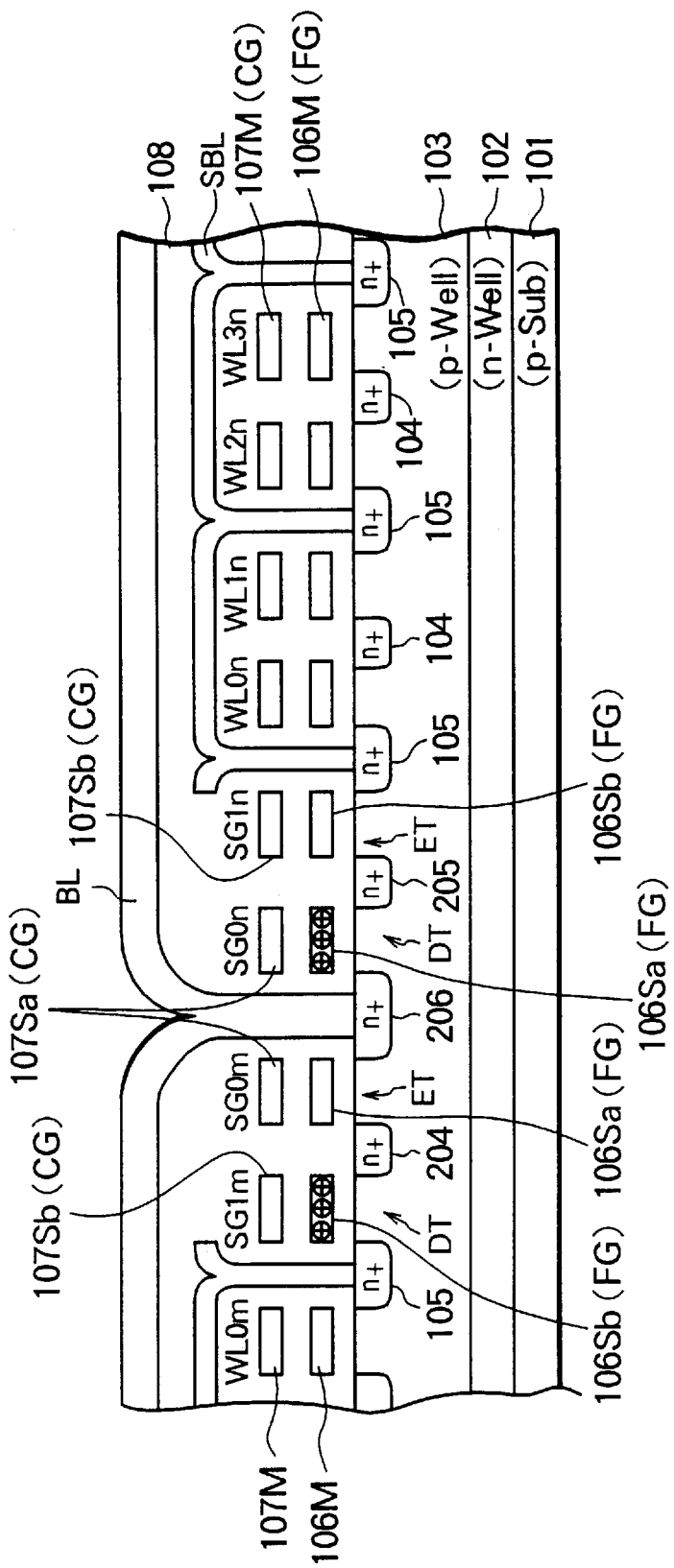
FIG. 11 is a plane view of principal parts of the semiconductor non-volatile memory device of FIG. 10.

FIG. 10 and 11 are views of a fifth embodiment of a semiconductor non-volatile memory device according to the present invention.

This fifth embodiment is another example of the actual structure of a semiconductor non-volatile memory device in which two upper selection transistors constructing the selection gate are provided, one being made to act as a depletion type transistor DT, another being made to act as an enhancement type transistor ET. FIG. 10 is a plane view of a principal part, and FIG. 11 is a schematic cross-sectional view taken along a line B—B in FIG. 9.

The differences of this fifth embodiment with the second embodiment as shown in FIG. 4 and FIG. 5 are that instead of two selection transistors which are connected in series and construct the selection gate, being constituted by usual n-channel MOS transistors and constituting the depletion type transistor DT by implanting an n-type impurity in a channel area of the nMOS transistor in the production process, the two selection transistors are constituted by non-volatile transistors having floating gates like as a memory cell transistor and the depletion type transistor DT is constituted before shipping by charging the floating gate of one of the selection transistors by programming.

Note that, in FIG. 11, the hatching is omitted for simplifying the drawing. Also, in FIG. 10 and FIG. 11, the same parts as in FIG. 5 and FIG. 6 showing the second embodiment are represented by the same numbers.

Namely, the semiconductor non-volatile memory device in FIG. 10 and FIG. 11 has a triple well structure. As shown in FIG. 11, an n-type well 102 is formed in a p-type semiconductor substrate 101, a p-type well 103 is formed in the n-type well 102, and source diffusion layers or drain diffusion layers 104, 105, 204, 205, 206 are formed on predetermined positions in the p-type well 103.

A memory cell transistor and a selection transistor have floating gates (FG) 106M, 106Sa, 106Sb, serving as a charge accumulation layer and constituted by a first layer of polycrystalline silicon (1PS), and control gates 107M, 107Sa, 107Sb constituted by a second layer of polycrystalline silicon (2PS).

Also, in the figure, 108 represents an interlayer insulator film constituted by, for example, $SiO_2$. BL represents a main bit line constituted by a first layer of aluminum (1Al), SBL represents sub-bit lines constituted by a third layer of polycrystalline silicon (3PS), and 1AC represents contacts for 1Al. Note that, a gate insulator film is omitted.

An explanation will be made next of the conversion of the selection transistor of the selection gate to a depletion transistor by programming with reference to FIGS. 12A to 12H and FIG. 13. Note that, FIGS. 12A to 12H are views for explaining the programming process, and FIG. 13 is a table of the bias conditions of the memory cell at time of an erasing operation and of the selection gate at the time of programming.

Figure 12A:
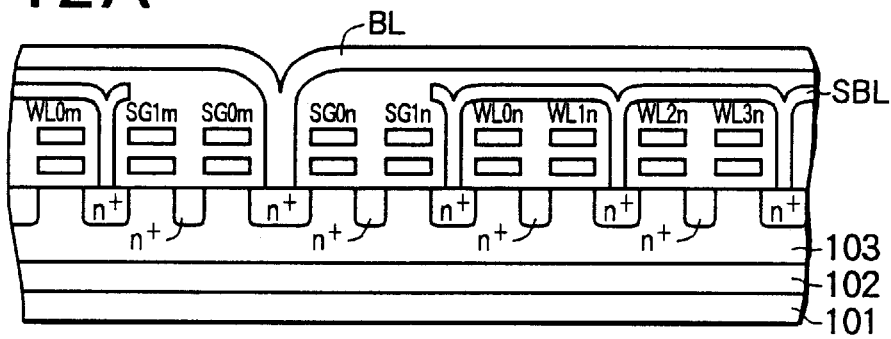
FIG. 12A to 12H are explanatory views of a process of setting a threshold voltage of a transistor constituting a selection gate to depletion.
Figure 12B:
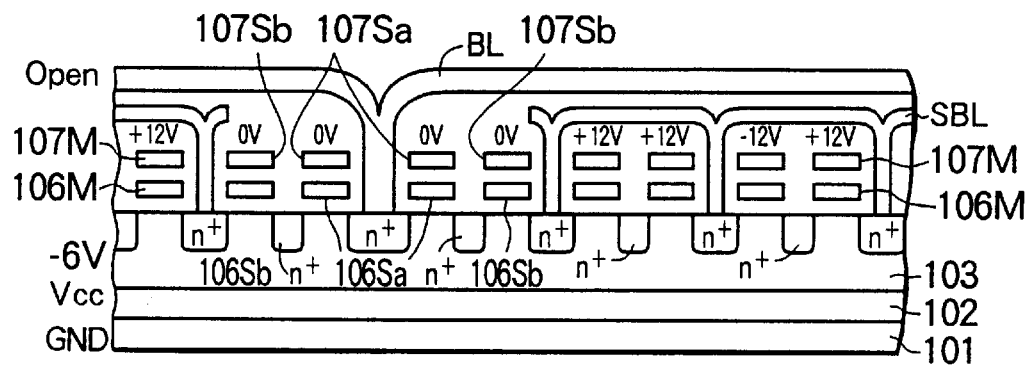

First, the erasing operation is performed on the memory cells in the initial state as shown in FIG. 12A. In the erasing operation, the bit line is set to an open state, for example, −6V is applied to the p-type well (p-well) and +12V is applied to the word lines WL0n~3n, whereby a high electric field is induced between the control gates 107M and the channels of the memory cells. As a result, electrons are injected to the floating gates 106M by FN (Fowler-Nordheim) tunneling and the memory cells become erased in state.

Figure 12C:
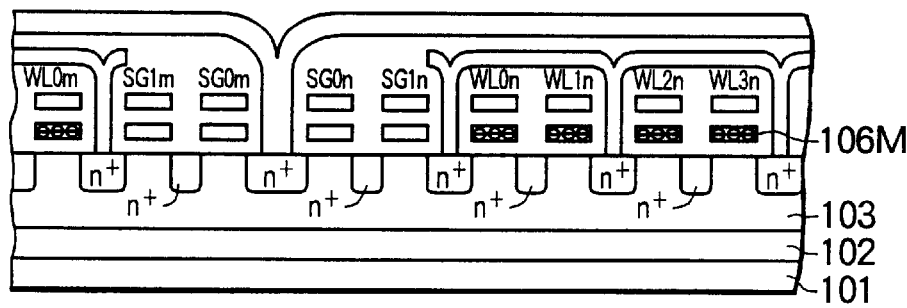

At this time, the selection signal supply lines SG0m, SG1n are set to 0V. Due to this, the electric field is not enough to induce the FN tunneling phenomenon, and the threshold voltage Vth of the selection gate holds the ultraviolet ray irradiated state (Vth≈1V). FIG. 12c shows the memory cell status after the erasing operation.

Next, programming of the selection gates is performed.

Two bit lines BL are connected to one sense amplifier, so the programming of the selection gates is performed twice by switching the bit lines.

For example, +5V is supplied to the object bit line of the programming by the sense amplifier, while 0V is supplied to the other bit line.

Figure 12D:
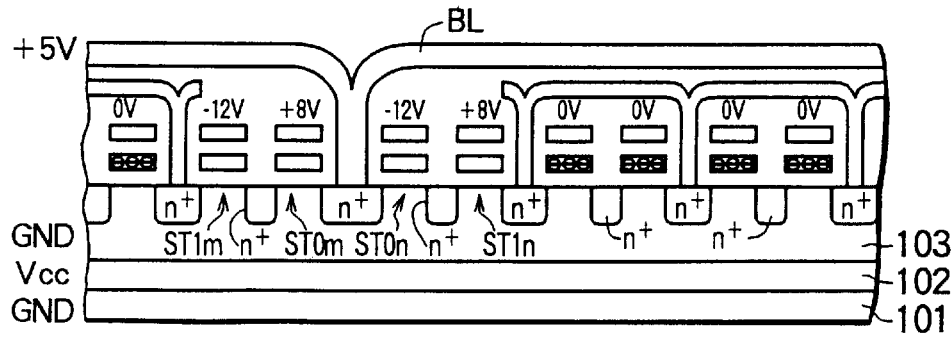

FIG. 12D is a view of the bias conditions at the time of the programming of the selection transistors ST1m, STn in which the control gates 107Sb, 107Sa are connected to the selection signal supply lines SG1m, SG0n.

Paying attention to the selection transistor ST1m of the selection gate SG1 side, the +5V applied to the main bit line BL is applied to a drain of the selection transistor ST1m though the selection transistor ST0m. At this time, +12V is applied to the selection signal supply line SG1m, whereby an electric field is induced. As a result, electrons of the floating gate 106Sb of the selection transistor ST1m are discharged by the FN tunneling. Due to this, the selection gate ST1m is converted to a depletion state.

The selection transistor ST0n of the selection gate SG0n side is exposed to the same electric field as the selection transistor ST1m. As a result, electrons of the floating gate 106Sa are discharged by the FN tunneling.

Note that, the depletion depths of the selection gates ST1m, ST0n are preferably as great as possible. Thus, verify control and a circuit for controlling the threshold voltage Vth are not necessary.

Also, the selection transistor is programmed by using the FN tunneling phenomenon, so it is possible to program each block or each chip and to program the selection gate in accordance with every erasing.

Figure 12E:
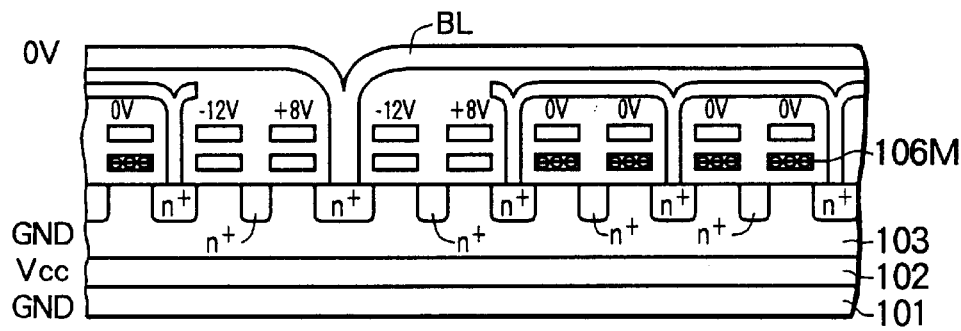

At this time, programming of the selection gate is not performed at the adjoining bit line. Thus, a so-call gate disturb phenomenon is induced. FIG. 12E shows the bias conditions of the adjoining bit line.

Figure 12F:
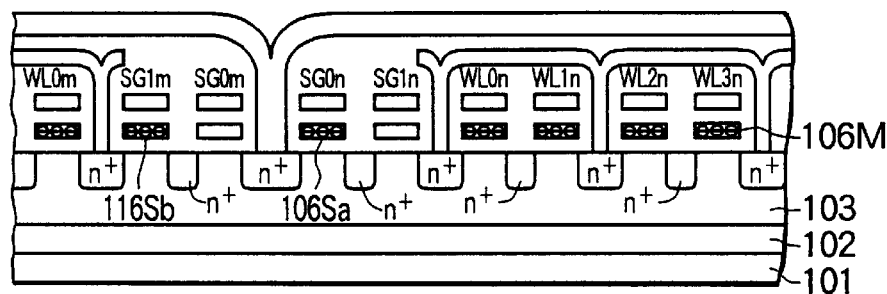

The electric field is induced between the drain 206 of the selection transistor ST0n, the drain 204 of the selection transistor ST1m and the floating gates 106Sa, 106Sb. However, this condition is the same as the bias condition for writing data "1" of the memory cell itself. The electric-field is not enough to induce the FN tunneling, and the floating gates of the selection gates are irradiated with ultraviolet light and held in a stable state. Thus, there is no problem with respect to the gate disturb phenomenon. Note that, FIG. 12F shows the selection gate status after the programming.

Figure 12G:
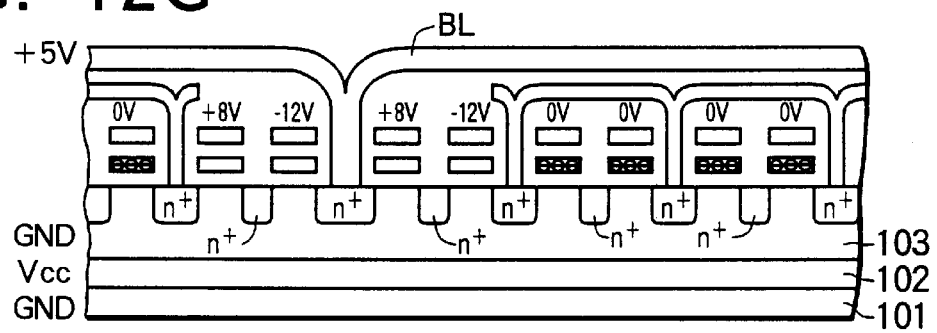
Figure 12H:
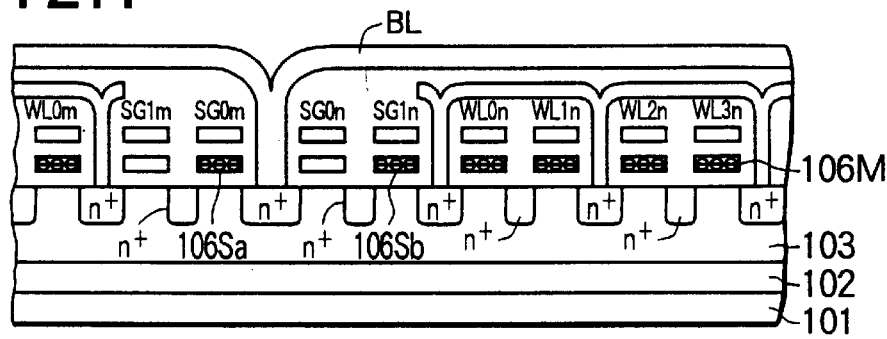

Next, the programming of the selection gate of the adjoining bit line side is performed. FIG. 12G and FIG. 12H show the bias conditions at the time of the programming and the status after the programming.

As seen from the above, the folded bit line structure is realized.

Also, it is possible to perform the writing and reading operation for the memory cell in the same way as with the above-mentioned second embodiment.

According to the fifth embodiment, in a DINOR type flash EEPROM, the two selection transistors are constituted by non-volatile transistors having floating gates the same as a memory cell transistor and the depletion type transistor DT is constituted before shipping by charging the floating gate of one of the selection transistors by programming. Therefore, it is possible to realize the folded bit line structure without a step of implanting ions for depletion by using a conventional process technology. Therefore the number of production steps can be reduced and, as a result, there are advantages in that a reduction of the costs can be achieved.

Note that, for holding a stable depletion state of the depletion type transistor DT of the selection gate, programming is preferably performed for the above-mentioned depletion when performing the usual erasing operation.

Many widely different embodiments of the present invention may be constructed without departing from the spirit and scope of the present invention, and it should be understood that the present invention is not restricted to the specific embodiments described above.

What is claimed is:

1. A semiconductor non-volatile memory device which has a differential type sense amplifier connecting first and second bit lines in parallel and amplifying a voltage difference between said first bit line and said second bit line, comprising:

a first selection gate connected between said first bit line and a first sub-bit line;

a second selection gate connected between said second bit line and a second sub-bit line;

a first memory cell block having a plurality of memory cells which are connected between said first sub-bit line and a reference voltage source through said first selection gate; and a second memory cell block having a plurality of memory cells which are connected between said second sub-bit line and said reference voltage source through said second selection gate, conductive and non-conductive states of said first memory cell block and said second memory cell block being controlled by a common word line group, conductive and non-conductive states of said first selection gate and said second selection gate being controlled by different selection signal lines respectively, said first selection gate operatively connecting said first sub-bit line to said first bit line, and said second selection gate operatively connecting said second sub-bit line to said second bit line.

2. A semiconductor non-volatile memory device according to claim 1, wherein said first memory cell block comprises a plurality of first memory cell units, each having a plurality of memory cells and said second memory cell block comprises a plurality of second memory cell units, each having a plurality of memory cells, said first selection gate and said second selection gate being arranged on opposite sides of said common word line group.

3. A semiconductor non-volatile memory device according to claim 1, comprising a means for holding the potential of either bit line of said first and second bit lines at a first potential and setting the potential of the other bit line at a second potential different from said first potential for a predetermined at the time of a reading operation.

4. A semiconductor non-volatile memory device according to claim 1, wherein said first and second selection gates are each constituted by connecting two selection transistors in series where either of said two selection transistors is a depletion type transistor.

5. A semiconductor non-volatile memory device according to claim 4, wherein said depletion type transistor is formed by implanting an impurity of a predetermined density into a channel area of a transistor.

6. A semiconductor non-volatile memory device according to claim 4, wherein said depletion type transistor is a transistor having a charge accumulation layer.

7. A semiconductor non-volatile memory device according to claim 4, wherein a threshold of said depletion type transistor is reset at the time of an erasing operation of said first memory cell block and said second memory cell block.

8. A semiconductor non-volatile memory device which has a main bit line; a plurality of sub-bit lines connected to said main bit line through selection gates; and a plurality of memory cells connected between said plurality of sub-bit lines and a reference voltage source, wherein said selection gates are each constituted by connecting two selection transistors in series where either of said two selection transistors is a depletion type transistor having a charge accumulation layer and a variable threshold.

9. A semiconductor non-volatile memory device according to claim 8, wherein said threshold of said depletion type transistor is reset at the time of an erasing operation of said memory cells.

* * * * *